(12) United States Patent
Yoshida et al.

(10) Patent No.: US 10,508,919 B2
(45) Date of Patent: Dec. 17, 2019

(54) COMPOSITE SENSOR

(71) Applicants: DENSO CORPORATION, Kariya, Aichi-pref. (JP); SEIKO EPSON CORPORATION, Tokyo (JP)

(72) Inventors: Naoki Yoshida, Kariya (JP); Tsugio Ide, Kamiina-gun (JP)

(73) Assignees: DENSO CORPORATION, Kariya (JP); SEIKO EPSON CORPORATION, Tokyo (JP)

( * ) Notice: Subject to any disclaimer, the term of this patent is extended or adjusted under 35 U.S.C. 154(b) by 168 days.

(21) Appl. No.: 15/752,915

(22) PCT Filed: Aug. 8, 2016

(86) PCT No.: PCT/JP2016/073237
§ 371 (c)(1),
(2) Date: Feb. 15, 2018

(87) PCT Pub. No.: WO2017/033717
PCT Pub. Date: Mar. 2, 2017

(65) Prior Publication Data
US 2018/0245919 A1  Aug. 30, 2018

(30) Foreign Application Priority Data

Aug. 21, 2015 (JP) ................. 2015-163890

(51) Int. Cl.
| | |
|---|---|
| *G01C 19/5628* | (2012.01) |
| *G01P 15/125* | (2006.01) |
| *G01C 19/5621* | (2012.01) |
| *B81B 3/00* | (2006.01) |

(Continued)

(52) U.S. Cl.
CPC ............ *G01C 19/5621* (2013.01); *B81B 3/00* (2013.01); *G01C 19/5628* (2013.01); *G01P 15/125* (2013.01); *H01L 29/84* (2013.01); *H01L 41/113* (2013.01)

(58) Field of Classification Search
CPC ........... G01P 15/125; G01P 2015/0862; G01P 2015/0865; G01C 19/5621; G01C 19/5628; G01C 19/5783
See application file for complete search history.

(56) References Cited

U.S. PATENT DOCUMENTS

2013/0312517 A1  11/2013  Jeong et al.
2013/0320803 A1  12/2013  Maeda
(Continued)

FOREIGN PATENT DOCUMENTS

| JP | 2012-068178 A | 4/2012 |
| JP | 2014-013207 A | 1/2014 |
| JP | 2015-102404 A | 6/2015 |

*Primary Examiner* — John E Chapman, Jr.
(74) *Attorney, Agent, or Firm* — Posz Law Group, PLC

(57) ABSTRACT

A composite sensor includes a first shield pattern that functions as a noise shield of a circuit board, a second shield pattern that functions as a noise shield of a first sensor, and a third shield pattern that functions as a noise shield of a second sensor. The first shield pattern has an impedance lower than the second shield pattern and the third shield pattern. The second shield pattern and the third shield pattern are electrically connected to each other through the first shield pattern. Accordingly, deterioration of detection accuracy caused by electrical noise is restricted.

7 Claims, 8 Drawing Sheets

(51) Int. Cl.
*H01L 29/84* (2006.01)
*H01L 41/113* (2006.01)

(56) References Cited

U.S. PATENT DOCUMENTS

2016/0298964 A1* 10/2016 Ide ..................... G01C 19/5642
2018/0003501 A1   1/2018 Yoshida et al.

* cited by examiner

COMPOSITE SENSOR

CROSS REFERENCE TO RELATED APPLICATIONS

This application is a U.S. national phase of International Application No. PCT/JP2016/073237 filed on Aug. 8, 2016 and is based on Japanese Patent Application No. 2015-163890 filed on Aug. 21, 2015, the disclosures of which are incorporated herein by reference.

TECHNICAL FIELD

The present disclosure relates to a composite sensor including a first sensor and a second sensor that detect different subjects and are mounted on a common mount member.

BACKGROUND ART

Conventionally, this kind of composite sensor has been proposed in, for example, a patent literature 1. An acceleration sensor outputting a sensor signal according to an acceleration and an angular velocity sensor outputting a sensor signal according to an angular velocity are mounted on one surface of a common mount member.

Specifically, the acceleration sensor and the angular velocity sensor are connected to the one surface of the common mount member through connection members each formed of a conductive member or the like. The connection member connecting the angular velocity sensor and the one surface of the mount member is positioned higher than the connection member connecting the acceleration sensor and the one surface of the mount member. The angular velocity sensor is, for example, a piezoelectric type sensor using a piezoelectric effect of a piezoelectric body. The angular velocity sensor outputs a sensor signal (e.g., electric charges) according to an angular velocity applied to the angular velocity sensor during a vibration of a drive vibrating reed.

Since the connection member connecting the angular velocity sensor and the mount member is positioned higher than the connection member connecting the acceleration sensor and the mount member, transmission of vibrations of the angular velocity sensor to the acceleration sensor is restricted. Therefore, the composite sensor restricts a noise (e.g., a mechanical noise) caused by the vibration of the angular velocity sensor from being applied to the acceleration sensor.

PRIOR ART LITERATURE

Patent Literature

Patent literature 1: JP 2014-13207 A

SUMMARY OF INVENTION

In the above composite sensor, a shield pattern fixed at a reference (i.e., ground) potential is disposed on the mount member to restrict effects of electrical noise on the acceleration sensor and the angular velocity sensor.

However, when a common shield pattern is employed for a shield pattern of the angular velocity sensor and a shield pattern of the acceleration sensor, there is a possibility that mutual interference of noise between the acceleration sensor and the angular velocity sensor occurs and detection accuracy is decreased.

It is an object of the present disclosure to provide a composite sensor capable of restricting deterioration of detection accuracy caused by an electrical noise.

According to a first aspect of the present disclosure, a composite sensor includes a first sensor, a second sensor, a circuit board, a mount member, a first shield pattern, a second shield pattern and a third shield pattern. The first sensor outputs a first sensor signal according to a detection subject. The second sensor outputs a second sensor signal according to a detection subject different from the detection subject of the first sensor. The circuit board is electrically connected to the first sensor and the second sensor. The mount member has a surface above which the first sensor, the second sensor and the circuit board are disposed. The first shield pattern functions as a noise shield of the circuit board. The second shield pattern functions as a noise shield of the first sensor. The third shield pattern functions as a noise shield of the second sensor. The first shield pattern has an impedance lower than the second shield pattern and the third shield pattern. The second shield pattern and the third shield pattern are electrically connected to each other through the first shield pattern.

According to the first aspect of the present disclosure, the second shield pattern and the third shield pattern are connected through the first shield pattern having the lowest impedance. A noise applied to the second shield pattern is restricted from being propagated to the third shield pattern and the noise applied to the third shield pattern is restricted from being propagated to the second shield pattern. Accordingly, mutual interference of electrical noise between the first sensor and the second sensor is restricted and the deterioration of the detection accuracy of the first sensor and the second sensor is restricted.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of the present disclosure will be described with reference to the drawings. In the following embodiments, descriptions will be given by labeling same or equivalent portions with the same symbols.

First Embodiment

Figure 1:
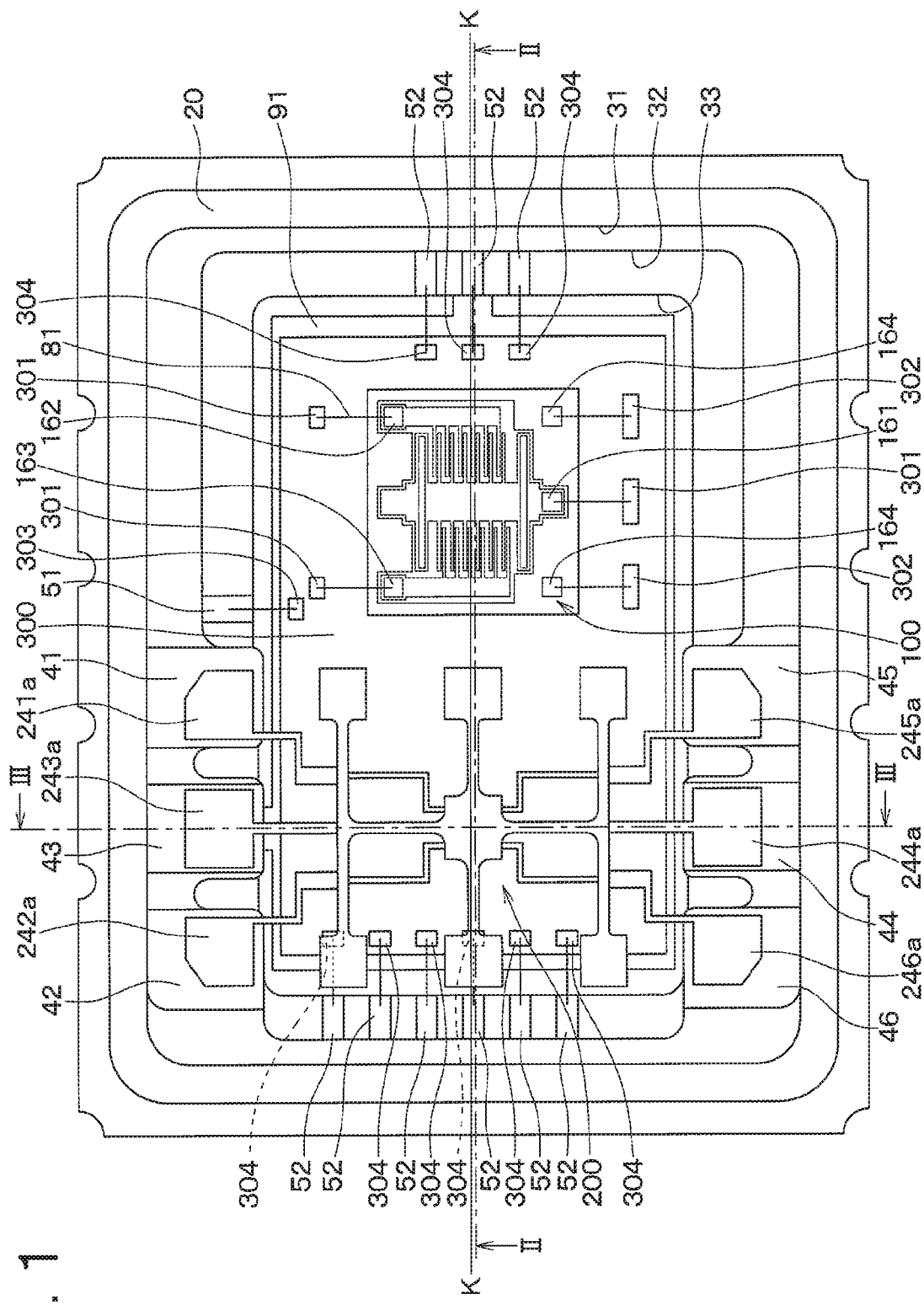
FIG. 1 is a plan view of a composite sensor according to a first embodiment of the present disclosure.
Figure 2:
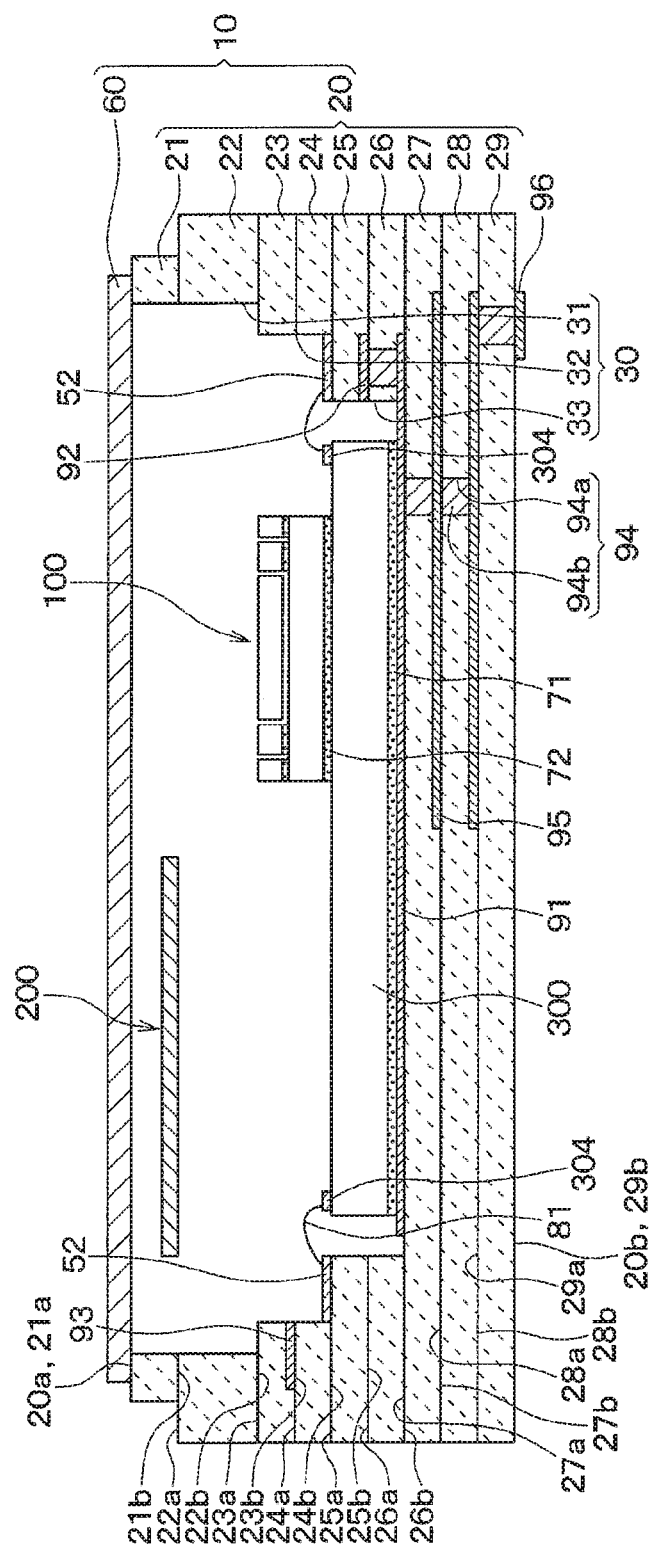
FIG. 2 is a cross-sectional view taken along a line II-II of FIG. 1.
Figure 3:
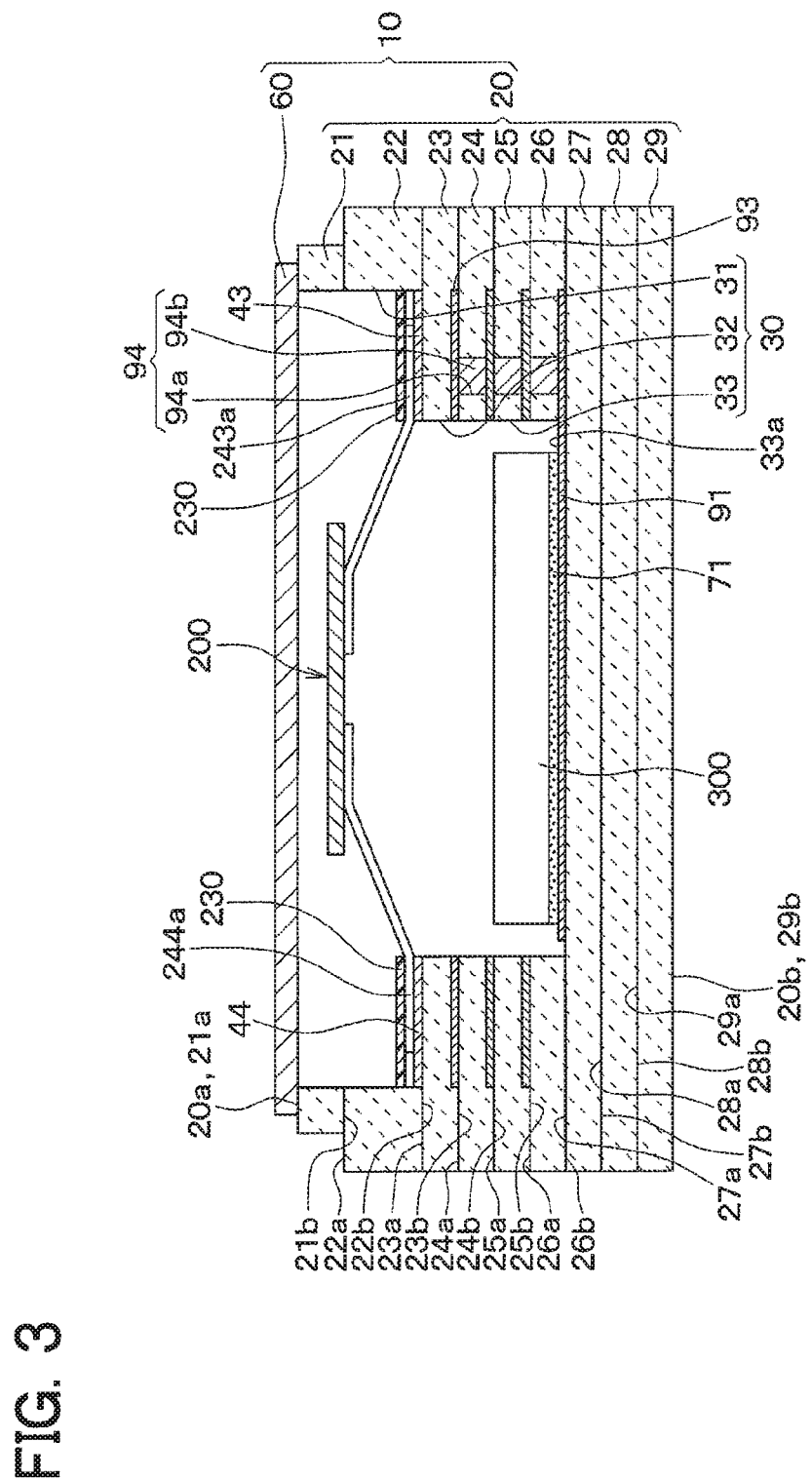
FIG. 3 is a cross-sectional view taken along a line III-III of FIG. 1.

A first embodiment of the present disclosure will be described with reference to the drawings. In the present embodiment, as shown in FIG. 1 to FIG. 3, a composite sensor includes a package 10 as a mount member, an acceleration sensor 100, an angular velocity sensor 200 and a circuit board 300 performing predetermined processing on the acceleration sensor 100 and the angular velocity sensor 200. In the present embodiment, the acceleration sensor 100 corresponds to a first sensor of the present disclosure and the angular velocity sensor 200 corresponds to a second sensor of the present disclosure. A lid 60 described below is omitted in FIG. 1.

Figure 4:
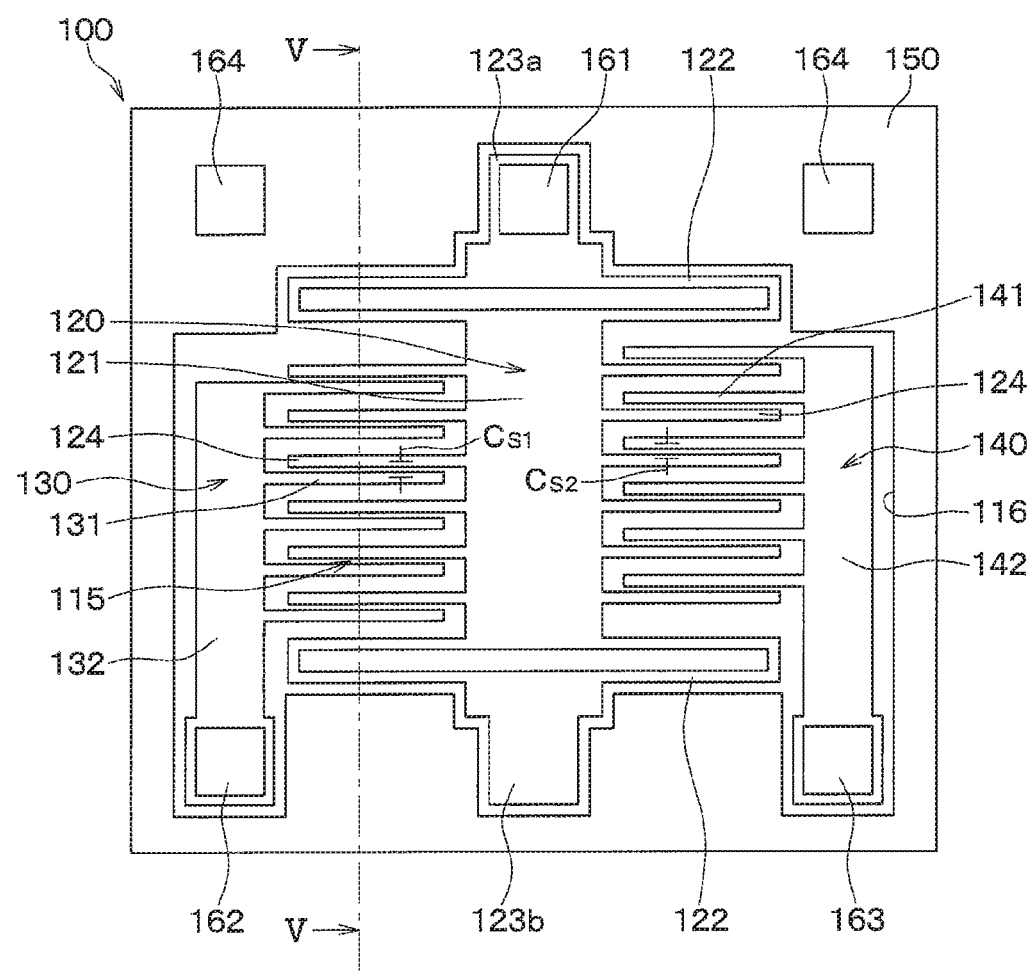
FIG. 4 is a plan view of a sensor portion of an acceleration sensor.
Figure 5:
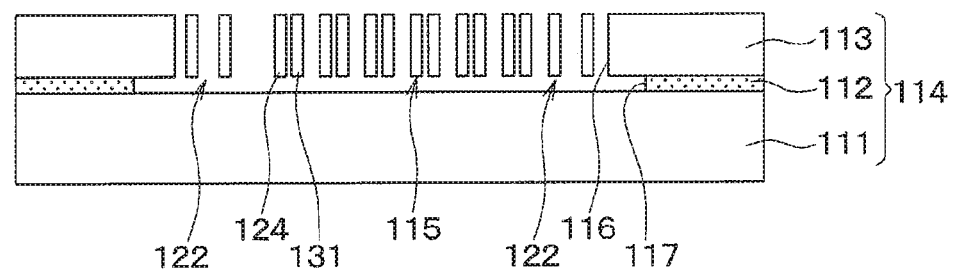
FIG. 5 is a cross-sectional view taken along a line V-V of FIG. 4.

A configuration of the acceleration sensor 100 of the present embodiment will be described first. The acceleration sensor 100 of the present embodiment is known as a capacitive type acceleration sensor, and outputs a first sensor signal. In the present embodiment, as shown in FIG. 4 and FIG. 5, the acceleration sensor 100 includes an SOI (Silicon on Insulator) substrate 114 having a rectangular planar shape. The SOI substrate 114 includes a semiconductor layer 113 stacked on a support substrate 111 via an insulation film 112. For example, a silicon substrate is used as the support substrate 111, $SiO_2$ or SiN is used as the insulation film 112, and a silicon or polysilicon substrate is used as the semiconductor layer 113.

The SOI substrate 114 is manufactured by a known micro-machine process, and has a sensing portion 115. Specifically, by providing a groove portion 116 in the semiconductor layer 113, a movable portion 120 having a comb-teeth beam structure, first fixed portions 130, and second fixed portions 140 are formed in the semiconductor layer 113. The beam structure provides the sensing portion 115 that outputs a sensor signal according to an acceleration. A portion of the semiconductor layer 113 surrounding the movable portion 120, the first fixed portions 130, and the second fixed portions 140 within the groove portion 116 is referred to as a peripheral portion 150.

The insulation film 112 has an opening 117 at a portion corresponding to a region where the beam structure 120 to 140 is formed. Accordingly, a predetermined region of the movable portion 120 and the first and second fixed portions 130 and 140 in the semiconductor layer 113 are released from the support substrate 111.

The movable portion 120 is disposed across the opening 117 and includes a rectangular weight portion 121. Both ends of the weight portion 121 in a longitudinal direction are integrally coupled to respective anchor portions 123a and 123b via respective beam portions 122. The anchor portions 123a and 123b are supported to the support substrate 111 via the insulation film 112 close to rim portions of the opening 117. Accordingly, the weight portion 121 and the beam portions 122 face the opening 117.

The beam portion 122 has a rectangular frame shape that has two parallel beams coupled to each other at both ends, and has a spring function to be displaced in a direction perpendicular to a longitudinal direction of the two beams. Specifically, the beam portion 122 allows the weight portion 121 to be displaced in the longitudinal direction of the weight portion 121 upon receipt of acceleration containing a component in a direction parallel to the longitudinal direction of the weight portion 121. The beam portion 122 also restores the weight portion 121 to an original state when the acceleration is dissipated. Hence, the weight portion 121 coupled to the support substrate 111 via the beam portion 122 is displaced in the same displacement direction as the beam portion 122 upon application of acceleration.

The movable portion 120 includes multiple movable electrodes 124 provided integrally with the weight portion 121. The movable electrodes 124 protrude from both side surfaces of the weight portion 121 in opposite directions which are perpendicular to the longitudinal direction of the weight portion 121. In FIG. 4, six movable electrodes 124 protrude toward a left side and a right side of the weight portion 121, and face the opening 117. The respective movable electrodes 124 are provided integrally with the weight portion 121 and the beam portion 122. The respective movable electrodes 124 are capable of being displaced together with the weight portion 121 in the longitudinal direction of the weight portion 121 when the beam portion 122 is displaced.

The first and second fixed portions 130 and 140 are supported to the support substrate 111 via the insulation film 112, and are disposed close to opposing rim portions of the opening 117 where the anchor portions 123a and 123b are not disposed. That is, the movable portion 120 is disposed between the first and second fixed portions 130 and 140. In FIG. 4, the first fixed portion 130 is disposed on a left side of the movable portion 120 in a sheet surface of FIG. 4, and the second fixed portion 140 is disposed on a right side of the movable portion 120 in the sheet surface of FIG. 4. The first and second fixed portions 130 and 140 are electrically independent from each other.

The first and second fixed portions 130 and 140 respectively have multiple first and second fixed electrodes 131 and 141. The fixed electrodes 131 and 141 are disposed to parallel to side surfaces of the movable electrodes 124 and the fixed electrodes 131 and 141 face the side surfaces of the movable electrodes 124 with predetermined detection intervals. The first and second fixed portions 130 and 140 respectively have first and second wiring portions 132 and 142 supported to the support substrate 111 via the insulation film 112.

In the present embodiment, as shown in FIG. 4, six first fixed electrodes 131 and six second fixed electrodes 141 are provided and aligned like comb teeth to mesh with clearances of the comb teeth of the movable electrodes 124. The first and second fixed electrodes 131 and 141 are supported in a cantilever manner by the wiring portions 132 and 142, respectively, and face the opening 117.

The movable portion 120 and the first and second fixed portions 130 and 140 respectively have a movable electrode pad 161 and first and second fixed electrode pads 162 and 163, all of which are electrically connected to pads 301 of the circuit board 300 described below. Specifically, the location region of the movable electrode pad 161 is opposite to the location regions of the first and second fixed electrode pads 162 and 163. To be more exact, in a pair of opposing sides of the SOI substrate 114 (i.e., the semiconductor layer 113), the movable electrode pad 161 is provided to the anchor portion 123a located near one side (i.e., an upper side in the sheet surface of FIG. 4). The first and second fixed electrode pads 162 and 163 are provided at predetermined positions in the first and second wiring portions 132 and 142 located near the other one side (i.e., a lower side in the sheet surface of FIG. 4).

In the present embodiment, peripheral portion pads 164 electrically connected to the pads 302 of the circuit board 300 are provided at predetermined positions in the peripheral portion 150.

The acceleration sensor 100 of the present embodiment has the configuration described hereinabove. Next, an operation of the acceleration sensor 100 will be described. In the acceleration sensor 100, as shown by capacitor symbols in FIG. 4, a first capacitance Cs1 is formed between the movable electrodes 124 and the first fixed electrodes 131. A second capacitance Cs2 is formed between the movable electrodes 124 and the second fixed electrodes 141. In order to detect acceleration, a pulse input signal (e.g., carrier wave) having predetermined amplitude and frequency is applied to the movable electrodes 124 (i.e., movable electrode pad 161) from the circuit board 300. When acceleration in a direction along the longitudinal direction of the weight portion 121 (i.e., an alignment direction of the movable electrodes 124 and the first and second fixed electrodes 131 and 141) is applied, the first and second capacitances Cs1 and Cs2 vary with displacement of the movable electrodes 124. Hence, acceleration is detected based on a difference between the first and second capacitances Cs1 and Cs2 (i.e., potential of the first and second fixed electrode pads 162 and 163).

That is, in the present embodiment, the movable electrode pad 161 corresponds to an input terminal of the present disclosure, and the first and second fixed electrode pads 162 and 163 correspond to output terminals of the present disclosure. In the following description, the movable electrode pad 161 is referred to as an input terminal 161 of the acceleration sensor 100, and the first and second fixed electrode pads 162 and 163 are referred to as output terminals 162 and 163 of the acceleration sensor 100. A reference (i.e., ground) potential is applied to the peripheral portion pads 164 to restrict fluctuation in potentials of the support substrate 111 and the peripheral portion 150.

Next, a configuration of the angular velocity sensor 200 will be described. The angular velocity sensor 200 of the present embodiment is known as a piezoelectric type angular velocity sensor, and outputs a second sensor signal according to an angular velocity. The angular velocity sensor 200 includes a sensor portion 210 shown in FIG. 6 and a support portion 220 shown in FIG. 7 and FIG. 8. The support portion 220 supports the sensor portion 210.

Figure 6:
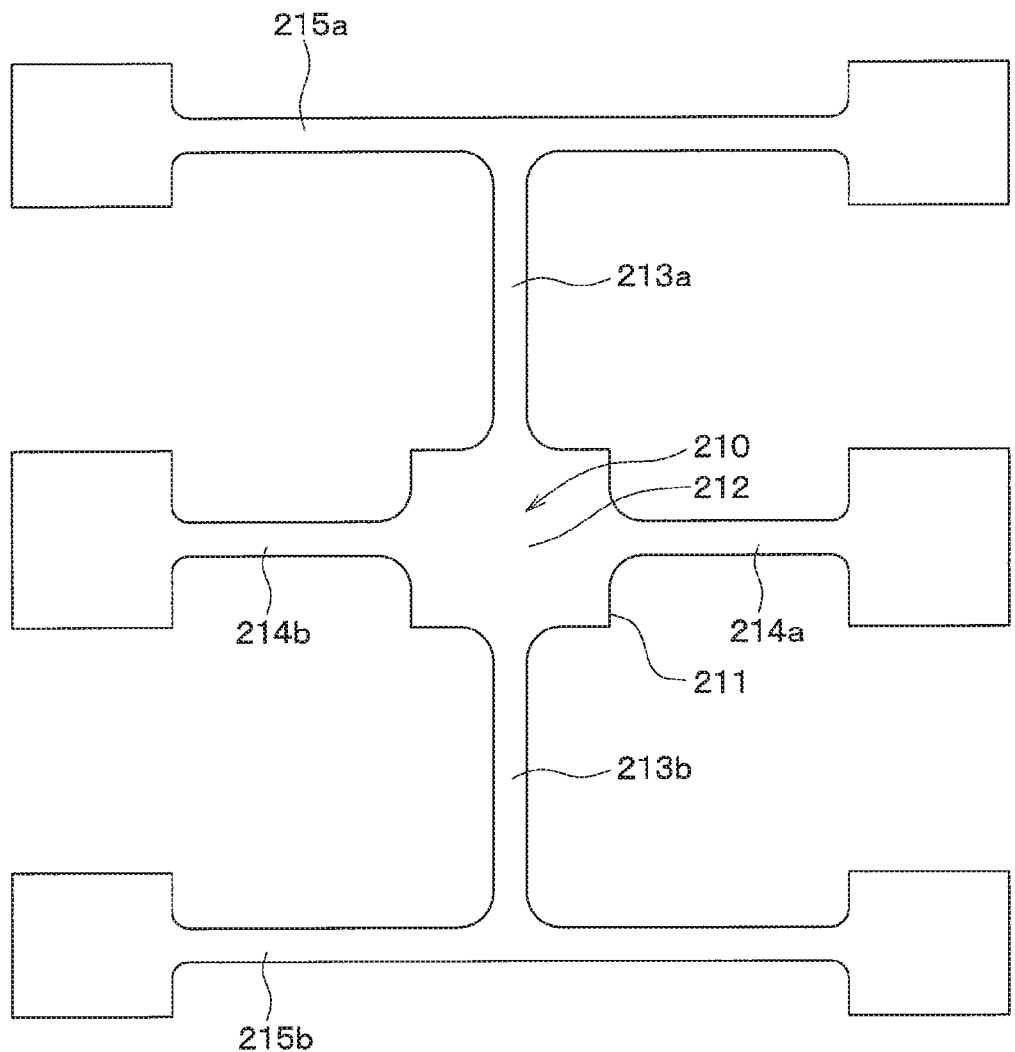
FIG. 6 is a plan view of a sensor portion of an angular velocity sensor.

Firstly, a configuration of he sensor portion 210 will be described. As shown in FIG. 6, the sensor portion 210 is manufactured by performing micro-machine processing to a substrate 211 made of a piezoelectric material, such as quartz, in a known manner. In FIG. 6, an x-axis direction is a horizontal direction in a sheet surface of FIG. 6, a y-axis direction is a direction perpendicular to the x-axis direction in a planar direction of the substrate 211, and a z-axis direction is a direction perpendicular to both of the x-axis direction and the y-axis direction.

The sensor portion 210 is disposed on an x-y plane aligned with a crystal axis of quartz forming the substrate 211, and is disposed in a point symmetrical manner with respect to a center point. Specifically, the sensor portion 210 has a rectangular base 212. The base 212 includes first and second coupling portions 213a and 213b extending along the y-axis from substantial centers of respective two side surfaces of the base 212 which are parallel to an x-z plane. The base 212 includes first and second detection vibrating reeds 214a and 214b extending along the x-axis from substantial centers of respective two side surfaces of the base 212 which are parallel to a y-z plane. The first and second coupling portions 213a and 213b are provided to extend along the y-axis in opposite directions with respect to the base 212. The first and second detection vibrating reeds 214a and 214b are provided to extend along the x-axis in opposite directions with respect to the base 212.

The first and second coupling portions 213a and 213b are provided, respectively, with first and second drive vibrating reeds 215a and 215b extending along the x-axis at respective tip ends on an opposite side to the base 212. The first and second drive vibrating reeds 215a and 215b are coupled, respectively, to the first and second coupling portions 213a and 213b at substantial centers in an extending direction.

Unillustrated electrodes are provided to the respective first and second detection vibrating reeds 214a and 214b and the respective first and second drive vibrating reeds 215a and 215b. Specifically, unillustrated first and second detection electrodes are provided to the first and second detection vibrating reeds 214a and 214b, respectively. Unillustrated first and second drive electrodes and first and second adjustment electrodes (i.e., ground electrodes) are provided to the first and second drive vibrating reeds 215a and 215b. The first drive electrode provided to the first drive vibrating reeds 215a and the second drive electrode provided to the second drive vibrating reeds 215b are provided at opposite positions with respect to the first and second detection vibrating reeds 214a and 214b. For example, the first drive electrode is provided on a surface of the first drive vibrating reeds 215a facing the first and second detection vibrating reeds 214a and 214b. In this case, the second drive electrode is provided on a surface of the second drive vibrating reeds 215b opposite to a surface of the second drive vibrating reeds 215b facing the first and second detection vibrating reeds 214a and 214b.

Further, unillustrated six lands (i.e., electrode patterns) are provided to a surface of the base 212 on a side supported by the support portion 220. Specifically, the base 212 is provided with a first detection land connected to the first detection electrode provided to the first detection vibrating reed 214a. The base 212 is provided with a second detection land connected to the second detection electrode provided to the second detection vibrating reed 214b. The base 212 is provided with a drive land connected to the first drive electrode provided to the first drive vibrating reed 215a and the second drive electrode provided to the second drive vibrating reed 215b. The base 212 is provided with an adjustment land (i.e., ground land) connected to the first adjustment electrode provided to the first drive vibrating reed 215a and the second adjustment electrode provided to the second drive vibrating reed 215b. The base 212 is provided with first and second ground lands disposed between the first and second detection lands, the drive land and the adjustment land. The first and second ground lands reduce floating capacitances generated between the first and second detection lands, the drive land and the adjustment land when ground potential is applied. The first and second detection lands, the drive land, the adjustment land and the first and second ground lands are electrically connected to the circuit board 300 via first to sixth leads 241 to 246 of the support portion 220 described below.

The sensor portion 210 of the angular velocity sensor 200 has the configuration described hereinabove. Next, the support portion 220 will be described.

Figure 7:
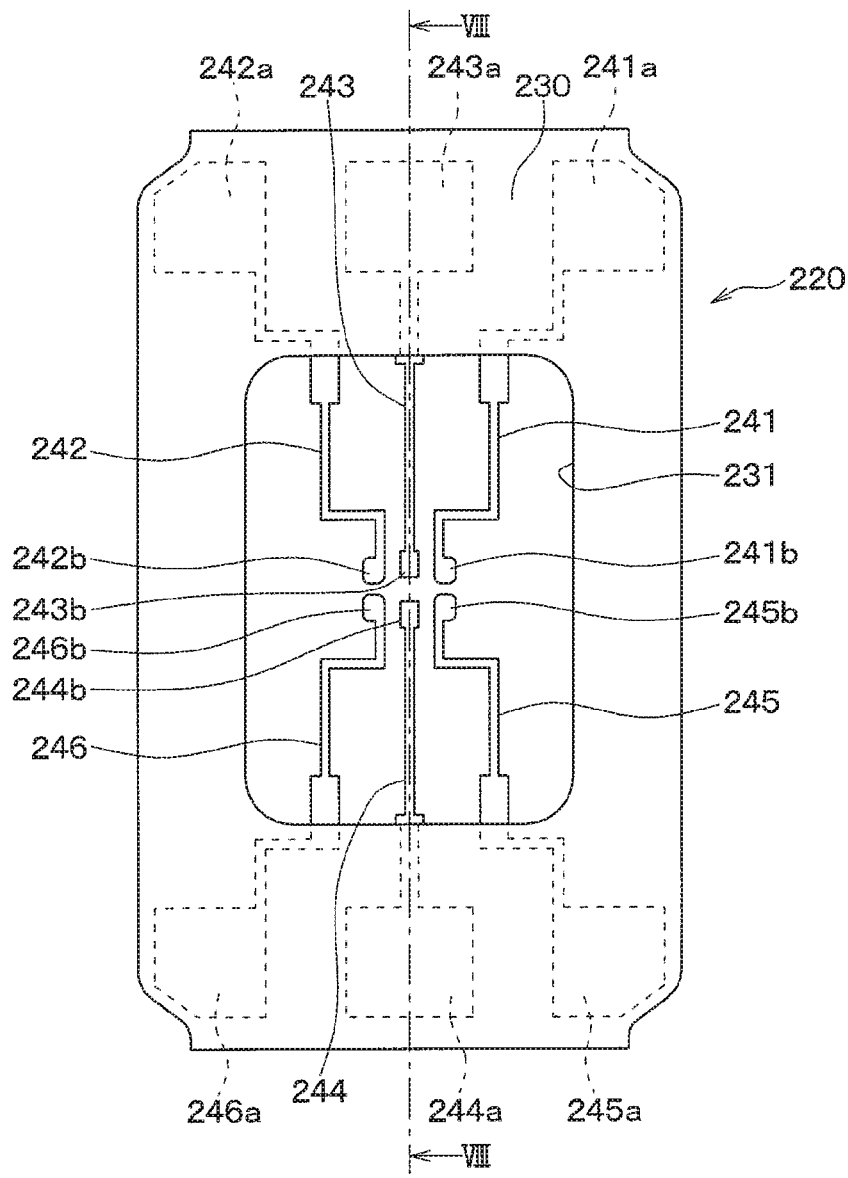
FIG. 7 is a plan view of a support portion of the angular velocity sensor.
Figure 8:
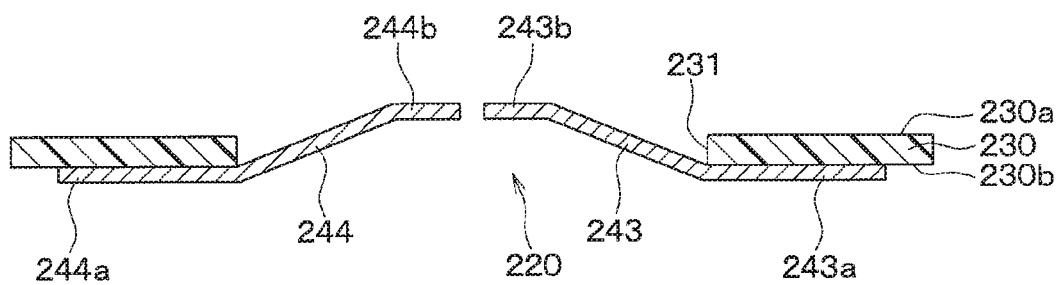
FIG. 8 is a cross-sectional view taken along a line VIII-VIII of FIG. 7.

As shown in FIG. 7 and FIG. 8, the support portion 220 is provided by a known TAB (tape automated bonding) tape which includes an insulation member 230 made of polyimide resin or the like and provided with the first to sixth leads 241 to 246 made of copper foil or the like. Specifically, the insulation member 230 has a substantially rectangular planar shape and provided with a device hole 231 substantially at a center. One ends 241a to 246a of the first to sixth leads 241 to 246 are disposed close to a periphery of the device hole 231 on a side of a rear surface 230b of the insulation member 230. The other ends 241b to 246b are bent to protrude from inside portion of the device hole 231 toward a surface 230a of the insulation member 230.

The one ends 241a to 246a of the first to sixth leads 241 to 246 are electrically connected to connection terminals 41 to 46 provided to a case 20 described below. The other ends 241b and 242b of the first and second leads 241 and 242 are connected to the first and second detection lands connected to the first and second detection electrode provided to the first and second detection vibrating reeds 214a and 214b. The other ends 243b of the third lead 243 is connected to the adjustment land connected to the first and second adjustment electrodes provided to the first and second drive vibrating reeds 215a and 215b. The other ends 244b of the fourth lead 244 is connected to the drive land connected to the first and second drive electrodes provided to the first and second drive vibrating reeds 215a and 215b. The other ends 245b and 246b of the fifth and sixth leads 245 and 246 are connected to the first and second ground lands. As such, the sensor portion 210 is spaced apart from the insulation member 230.

A locational relation of the one ends 241a to 246a of the first to sixth leads 241 to 246 will be described. In the present embodiment, as shown in FIG. 7, when viewed in a direction normal to the surface 230a of the insulation member 230, the one ends 241a to 243a of the first to third leads 241 to 243 are disposed on opposite ends to the one ends 244a to 246a of the fourth to sixth leads 244 to 246. Specifically, in a pair of opposing sides of the insulation member 230, the one ends 241a to 243a of the first to third leads 241 to 243 are disposed near one side (upper side in a sheet surface of FIG. 7), and the one ends 244a to 246a of the fourth to sixth leads 244 to 246 are disposed near the other one side (upper side in a sheet surface of FIG. 8). In other words, the one ends 241a to 246a of the first to third leads 241 to 243 are disposed in one region, and the one ends 244a to 246a of the fourth to sixth leads 244 to 246 are disposed in another region, and the device hole 231 being positioned between the one region and another region.

The angular velocity sensor 200 of the present embodiment has the configuration described hereinabove. In FIG. 1, the insulation member 230 of the support portion 220 is omitted.

An operation of the angular velocity sensor 200 will be described. In detection of an angular velocity with the angular velocity sensor 200, a pulse input signal (i.e., carrier wave) having predetermined amplitude and frequency is applied to the first drive electrode provided to the first drive vibrating reed 215a and the second drive electrode (i.e., the one end 244a of the fourth lead 244) provided to the second drive vibrating reed 215b. Accordingly, since the first and second drive vibrating reeds 215a and 215b have the first and second electrodes at positions opposite to each other with respect to the first and second detection vibrating reeds 214a and 214b, the first and second drive vibrating reeds 215a and 215b are driven to vibrate oppositely along the y-axis in FIG. 6. In short, the first and second drive vibrating reeds 215a and 215b are driven to vibrate, and open and close with each other.

While no angular velocity is applied, moments applied to the first and second detection vibrating reeds 214a and 214b from the first and second drive vibrating reeds 215a and 215b are opposite and cancelled out with each other. Hence, the first and second detection vibrating reeds 214a and 214b are substantially in stationary state. In the present embodiment, input signals inputted to the first drive electrode of the first drive vibrating reed 215a and the second drive electrode (i.e., the one end 244a of the fourth lead 244) of the second drive vibrating reed 215b are set at a frequency such that the input signals inputted to the first drive electrode and the second drive electrode and an input signal inputted to the acceleration sensor 100 are not combined to a high-order harmonic at least higher than a fifth order. Thus, the two input signals are less likely to resonate with each other.

When electric charges generated at the first adjustment electrode of the first drive vibrating reed 215a and the second adjustment electrode of the second drive vibrating reed 215b (i.e., the one end 243a of the third lead 243) are outputted to the circuit board 300, an input signal inputted to the first drive electrode of the first drive vibrating reed 215a and the second drive electrode of the second drive vibrating reed 215b (i.e., the one end 244a of the fourth lead 244) is adjusted by an I/V converter circuit (e.g., current/voltage converter circuit) and an auto-gain-control circuit provided to the circuit board 300. The auto-gain-control circuit adjusts the amplitude of the input signals.

That is, the fourth lead 244 connected to the first drive electrode of the first drive vibrating reed 215a and the second drive electrode of the second drive vibrating reed 215b functions as an input portion to which an input signal is inputted. The one end 244a of the fourth lead 244 functions as an input terminal. The third lead 243 connected to the first adjustment electrode of the first drive vibrating reed 215a and the second adjustment electrode of the second drive vibrating reed 215b functions as an output portion from which the electric charges are outputted to the circuit board 300. The one end 243a of the third lead 243 functions as an output terminal. In the description below, the one end 243a of the third lead 243 is referred to as the output terminal 243a, and the one end 244a of the fourth lead 244 is referred to as the input terminal.

When an angular velocity ω is applied about the z-axis direction in a state as above, the first and second drive vibrating reeds 215a and 215b vibrate oppositely in the x-axis direction due to a Coriolis force. The first and second detection vibrating reeds 214a and 214b thus vibrate oppositely in a circumferential direction about the z-axis direction. Electric charges corresponding to the vibrations are generated at the unillustrated first and second detection electrodes (i.e., the one ends 241a and 242a of the first and second leads 241 and 242) provided to the first and second detection vibrating reeds 214a and 214b. An angular velocity is detected when the electric charges are outputted to the circuit board 300. That is, the one ends 241a and 242a of the first and second leads 241 and 242 connected to the first and second detection vibrating reeds 214a and 214b function as output terminals, In the description below, the one ends 241a and 242a of the first and second leads 241 and 242 are referred to as the output terminals 241a and 242a.

The circuit board 300 is provided with various circuits applying predetermined processing on the acceleration sensor 100 and the angular velocity sensor 200. For example, the various circuits may include, an amplifier circuit, an I/V converter circuit, an auto-gain-control circuit, a comparator and a wiring. As shown in FIG. 1, the circuit board 300 includes pads 301 and 302 connected to the acceleration sensor 100, a pad 303 connected to the connection terminal 51 and a pad 304 connected to the connection terminal 51. The pad 303 is electrically connected to the pad 302 via the wiring provided to the circuit board 300. In the present embodiment, the circuit board 300 outputs an analog signal to an external circuit according to signals outputted from the output terminals 162 and 163 of the acceleration sensor 100 and signals outputted from the output terminals 241a and 242a of the angular velocity sensor 200.

Next, a basic structure of the package 10 will be described.

As shown in FIG. 2 and FIG. 3, the package 10 includes the case 20 and the lid 60. In the present embodiment, the case 20 is provided by a multi-layer board including first to ninth ceramic layers 21 to 29 that are made of alumina or the like and are stacked in order. The case 20 has a box shape with a recess 30 provided to one surface 20a. In the case 20, the one surface 20a is defined by a front surface 21a of the first ceramic layer 21 and the other surface 20b is defined by a rear surface 29b of the ninth ceramic layer 29. The first to ninth ceramic layers 21 to 29 are disposed such that the front surfaces 21a to 29a face the one surface 20a and the rear surfaces 21b to 29b face the other surface 20b.

The recess 30 includes a first recess 31, a second recess 32 and a third recess 33. The first recess 31 is formed from the first ceramic layer 21 to the second ceramic layer 22. The second recess 32 is formed from the third ceramic layer 23 defining a bottom surface of the first recess 31 to the fourth ceramic layer 24 (see FIG. 2). The third recess 33 is formed from the fifth ceramic layer 25 defining a bottom surface of the second recess 32 to the sixth ceramic layer 26.

As shown in FIG. 1 and FIG. 3, the case 20 includes first to sixth connection terminals 41 to 46 on the front surface 23a of the third ceramic layer 23 defining the bottom surface of the first recess 31. As shown in FIG. 1 and FIG. 2, the case 20 includes a connection terminal 51 and multiple connection terminals 52 on the front surface 25a of the fifth ceramic layer 25 defining a bottom surface of the second recess 32. The first to sixth connection terminals 41 to 46 and at least one of the multiple connection terminals 52 are electrically connected through unillustrated wiring layers, through-via electrodes and the like formed inside of the case 20 and formed on the wall surface of the first to third recesses 31 to 33.

In the present embodiment, the first to sixth connection terminals 41 to 46 correspond to second sensor connection terminals and the connection terminal 51 corresponds to a first sensor connection terminal.

The lid 60 is made of metal or the like, and is bonded to the one surface 20a of the case 20 by unillustrated conductive adhesive or the like. The case 20 is thus covered and an interior of the case 20 is hermetically sealed. In the present embodiment, the interior of the case 20 is at a vacuum pressure. The package 10 of the present embodiment has the basic structure described hereinabove.

The acceleration sensor 100, the angular velocity sensor 200, and the circuit board 300 are accommodated in the package 10. Specifically, as shown in FIG. 1 to FIG. 3, the circuit board 300 is mounted on the bottom surface of the third recess 33 (i.e., the front surface 27a of the seventh ceramic layer 27) via an adhesive 71. When viewed in a direction normal to the bottom surface of the third recess 33 (hereinafter, referred to simply as the normal direction), the acceleration sensor 100 and the angular velocity sensor 200 are disposed side by side on the circuit board 300 (i.e., inside the case 20).

To be more exact, as shown in FIG. 1 and FIG. 2, the acceleration sensor 100 is mounted on the circuit board 300 via an adhesive 72. The input terminal 161, the output terminals 162 and 163 are electrically connected to the pads 301 of the circuit board 300 via wires 81 and the peripheral portion pads 164 are electrically connected to the pads 302 of the circuit board 300 via the wires 81.

Regarding the angular velocity sensor 200, the one ends 241a to 246a of the first to sixth leads 241 to 246 are electrically and mechanically connected to the first to sixth connection terminals 41 to 46 formed at the bottom surface of the second recess 32 via an unillustrated conductive member, such as solder. Thus, the sensor portion 210 is afloat in midair in an internal space of the case 20. In short, the angular velocity sensor 200 is accommodated in the case 20 while being apart from the circuit board 300. In the present embodiment, the bottom surface of the third recess 33 (i.e., the front surface 27a of the seventh ceramic layer 27) corresponds to a surface of the mount member. The acceleration sensor 100 and the angular velocity sensor 200 are positioned above the surface of the mount member.

To be more exact, as described above, the input terminal 161 of the acceleration sensor 100 is disposed on opposite side from (i.e., apart from) the output terminals 162 and 163 of the acceleration sensor 100. Likewise, as described above, the input terminal 244a of the angular velocity sensor 200 is disposed on opposite side from (i.e., apart from) the output terminals 241a to 243a of the angular velocity sensor 200. As shown in FIG. 1, the acceleration sensor 100 and the angular velocity sensor 200 are disposed such that the input terminal 161 of the acceleration sensor 100 and the input terminal 244a of the angular velocity sensor 200 are disposed on a same side, and the output terminals 162 and 163 of the acceleration sensor 100 and the output terminals 241a to 243a of the angular velocity sensor 200 are disposed on another same side. That is, a straight line extending in an arrangement direction of the acceleration sensor 100 and the angular velocity sensor 200 and passing centers of the acceleration sensor 100 and the angular velocity sensor 200 is referred to as a virtual line K. The input terminal 161 of the acceleration sensor 100 and the input terminal 244a of the angular velocity sensor 200 are disposed in one of two regions divided by the virtual line K (i.e., lower region below the virtual line K on a sheet surface of FIG. 1). The output terminals 162 and 163 of the acceleration sensor 100 and the output terminals 241a to 243a of the angular velocity sensor 200 are disposed in the other one of two regions (i.e., upper region above the virtual line K on the sheet surface of FIG. 1). In other words, the terminal 161 of the acceleration sensor 100 having low input impedance and the terminal 244a of the angular velocity sensor 200 having low input impedance are disposed in one of the two regions divided by the virtual line K (i.e., lower region below the virtual line K on the sheet surface of FIG. 1). The output terminals 162 and 163 of the acceleration sensor 100 having high output impedance and the output terminals 241a to 243a of the angular velocity sensor 200 having high output impedance are disposed in the remaining one of the two regions divided by the virtual line K (i.e., upper region above the virtual line K on the sheet surface of FIG. 1).

The pad 303 provided to the circuit board 300 and not connected to the pads 161 to 163 of the acceleration sensor 100 is electrically connected to the connection terminals 51 provided at the bottom surface of the second recess 32 via wires 81. As such, the peripheral portion pads 164 are connected to the connection terminal 51 via the pads 302 and 303.

In the present embodiment, when viewed in the normal direction, the pad 303 is disposed between the output terminals 162 and 163 of the acceleration sensor 100 and the output terminals 241a to 243a of the angular velocity sensor 200. Specifically, the pad 303 is positioned closer to the angular velocity sensor 200 than the pads 301 of the circuit board 300 connected to the output terminals 162 and 163 of the acceleration sensor 100. The wire 81 connecting the pad 303 and the connection terminal 51 is disposed between the wires 81, which connect the output terminals 162 and 163 of the acceleration sensor 100 and the pads 301 of the circuit board, and the connection portions between the output terminals 241a to 243a of the angular velocity sensor 200 and the first to third connection terminals 41 to 43 formed on the bottom surface of the first recess 31. The connection terminal 51 has a potential fixed at a predetermined reference (i.e., ground) potential. The peripheral portion pads 164 (i.e., the peripheral portion 150) are connected to the connection terminal 51 and fixed at the reference potential.

The pads 304 provided to the circuit board 300 and not connected to the acceleration sensor 100 are electrically connected to the connection terminals 52 provided at the bottom surface of the second recess 32 via wires 81.

As shown in FIG. 2, each of the wires 81 connecting the pad 304 and the connection terminal 52 is bent and disposed between the pad 304 and the connection terminal 52. The wire 81 is disposed such that a portion of the wire 81 most spaced apart from the bottom surface of the third recess 33 (i.e., the front surface 27a of the seventh ceramic layer 27) is disposed at a position closer to the bottom surface of the third recess 33 than a portion of the acceleration sensor 100 located at opposite side of the circuit board 300 (i.e., one surface of the semiconductor layer 113 opposite to the insulation film 112 shown in FIG. 5).

The composite sensor of the present embodiment has the basic structure described hereinabove. Next, a characteristic structure of the case 20 will be described.

Figure 9:
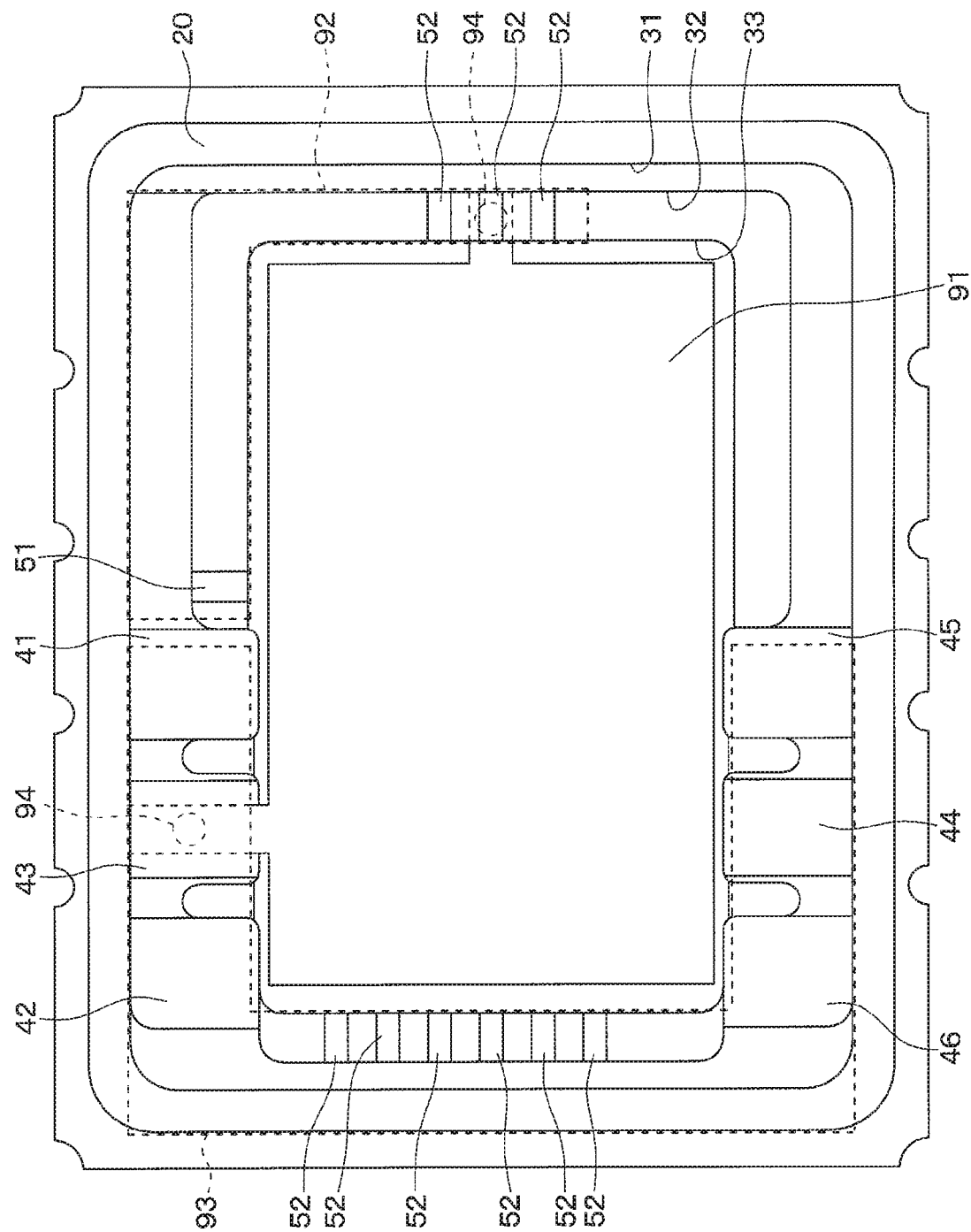
FIG. 9 is a schematic plan view of a case of FIG. 1.

In the present embodiment, as shown in FIGS. 2, 3 and 9, the case 20 includes first to third shield patterns (e.g., guard rings) 91 to 93 as noise shields. Specifically, the first shield pattern 91 is disposed on the front surface 27a of the seventh ceramic layer 27, the second shield pattern 92 is disposed on the front surface 26a of the sixth ceramic layer 26, and the third shield pattern 93 is disposed on the front surface 24a of the fourth ceramic layer 24. That is, the first to third shield patterns 91 to 93 are disposed on the front surfaces of the different ceramic layers.

More specifically, the first shield pattern 91 mainly functions as a noise shield of the circuit board 300. The first shield pattern 91 has a substantially rectangular shape and is disposed on a portion of the front surface 27a of the seventh ceramic layer 27 facing the circuit board 300. The second shield pattern 92 mainly functions as a noise shield of the acceleration sensor 100 (e.g., a noise shield of the connection terminal 51 connected to the peripheral portion 150 of the acceleration sensor 100 and having the potential of the peripheral portion 150). The second shield pattern 92 has a substantially L-shape and is disposed on a portion of the front surface 26a of the sixth ceramic layer 26 facing the connection terminal 51. The third shield pattern 93 mainly functions as a noise shield of the angular velocity sensor 200. The third shield pattern 93 has a substantially U-shape and is disposed on a portion of the front surface 24a of the fourth ceramic layer 24 facing the terminals 241a to 246a of the angular velocity sensor 200.

The case 20 includes multiple through-via electrodes 94. Each of the through-via electrodes 94 is provided by an electrode 94b implanted in a through hole 94a penetrating the ceramic layer. The second shield pattern 92 and the third shield pattern 93 are electrically connected through the through-via electrodes 94 and the wiring layers 95 disposed on the front surfaces of the proper ceramic layers. Specifically, the second shield pattern 92 is electrically connected to the first shield pattern 91 through the through-via electrode 94 formed in the sixth ceramic layer 26 (see FIG. 2). The third shield pattern 93 is electrically connected to the first shield pattern 91 through the through-via electrodes 94 formed in the fourth to sixth ceramic layers 24 to 26 and the wiring layers 95 formed on the front surfaces 25a and 26a of the fifth ceramic layer 25 and the sixth ceramic layer 26 (see FIG. 3). That is, the number of the through-via electrodes 94 disposed between the second shield pattern 92 and the first shield pattern 91 is different from the number of the through-via electrodes 94 disposed between the third shield pattern 93 and the first shield pattern 91. In the present embodiment, the number of the through-via electrodes 94 disposed between the second shield pattern 92 and the first shield pattern 91 is less than the number of the through-via electrodes 94 disposed between the third shield pattern 93 and the first shield pattern 91.

As shown in FIG. 2, the case 20 includes an external connection terminal 96 on the other surface 20b. The first shield pattern 91 is electrically connected to the external connection terminal 96 through the through-via electrodes 94 formed in the seventh to ninth ceramic layers 27 to 29 and the wiring layers 95 formed on the front surface 28a of the eighth ceramic layer 28 and the front surface 29a of the ninth ceramic layer 29. As such, the first shield pattern 91 is electrically connected to the external circuit (e.g., ground). Although not especially illustrated, the connection terminals 51 and 52 are electrically connected to the external connection terminal formed on the other surface 20b of the case 20 through the wiring layers and through-via electrodes provided to the proper ceramic layers.

The case 20 of the present embodiment has the structure described hereinabove. In the case 20, the through-via electrode 94 has slight resistance component and the number of the through-via electrodes 94 disposed between the second shield pattern 92 and the first shield pattern 91 is less than the number of the through-via electrodes 94 disposed between the third shield pattern 93 and the first shield pattern 91. Therefore, the impedance is increased in an order of the first shield pattern 91, the second shield pattern 92 and the third shield pattern 93. That is, the second shield pattern 92 and the third shield pattern 93 are connected through the first shield pattern 91 having the lowest impedance. The noise applied to the second shield pattern 92 is likely to be propagated to the first shield pattern 91 and then propagated to the external connection terminal 96. The noise applied to the second shield pattern 92 is restricted from being propagated to the third shield pattern 93. Namely, the noise applied to the acceleration sensor 100 is restricted from affecting the angular velocity sensor 200. The noise applied to the third shield pattern 93 is likely to be propagated to the first shield pattern 91 and then propagated to the external connection terminal 96. The noise applied to the third shield pattern 93 is restricted from being propagated to the second shield pattern 92. Namely, the noise applied to the angular velocity sensor 200 is restricted from affecting the acceleration sensor 100.

The noise applied to the first shield pattern 91 is directly propagated to the external connection terminal 96 because the second shield pattern 92 and the third shield pattern 93 have higher impedance than the first shield pattern 91.

As described above, in the present embodiment, the second shield pattern 92 and the third shield pattern 93 are connected through the first shield pattern 91 having the lowest impedance. As such, the noise applied to the second shield pattern 92 is restricted from being propagated to the third shield pattern 93 and the noise applied to the third shield pattern 93 is restricted from being propagated to the second shield pattern 92. Accordingly, mutual interference of electrical noise between the acceleration sensor 100 and the angular velocity sensor 200 is restricted and the deterioration of the detection accuracy of the acceleration sensor 100 and the angular velocity sensor 200 is restricted.

In the present embodiment, the input terminal 161 of the acceleration sensor 100 and the input terminal 244a of the angular velocity sensor 200 are disposed in one of the two regions divided by the virtual line K, and the output terminals 162 and 163 of the acceleration sensor 100 and the output terminals 241a to 243a of the angular velocity sensor 200 are disposed in the remaining one of the two regions divided by the virtual line K. That is, the input terminals 161 and 244a receiving the signal that is likely to generate the noise are disposed apart from the output terminals 162, 163, 241a to 243a that is likely to be affected by the noise. The signals inputted into the input terminals 161 and 244a are restricted from affecting the signals outputted from the output terminals 162, 163, 241a to 243a and the deterioration of the detection accuracy is restricted.

As described above, the input terminals 161 and 244a and the output terminals 162, 163, 241a to 243a of the acceleration sensor 100 and the angular velocity sensor 200 are disposed on the same side. Therefore, the layout (e.g., route) of the wiring layers formed inside the case 20 and at the wall surfaces of the first to third recesses 31 to 33 is simplified.

The wire 81 is disposed such that the portion of the wire 81 most spaced apart from the bottom surface of the third recess 33 is disposed at the position closer to the bottom surface of the third recess 33 than the portion of the acceleration sensor 100 located at opposite side of the circuit board 300 (i.e., one surface of the semiconductor layer 113 opposite to the insulation film 112). That is, the wire 81 is shortened. In this case, the parasitic capacitance generating in the wire 81 is decreased and the effect of the parasitic capacitance on the detection accuracy is restricted.

In the present embodiment, the acceleration sensor 100 is the capacitive type sensor, and the angular velocity sensor 200 is the piezoelectric type sensor. Hence, the angular velocity sensor 200 achieves higher sensitivity by narrowing a resonance frequency range. The acceleration sensor 100 achieves higher Q-value and restricts deterioration of detection accuracy caused by vibrations of the angular velocity sensor 200.

The acceleration sensor 100 is mounted on the bottom surface of the third recess 33 via the circuit board 300, and the angular velocity sensor 200 is connected to the first to sixth connection terminals 41 to 46 provided at the bottom of the first recess 31. In short, the acceleration sensor 100 and the angular velocity sensor 200 are bonded to different regions. Hence, transmission of vibrations of the angular velocity sensor 200 to the acceleration sensor 100 is restricted. Consequently, deterioration of detection accuracy of the acceleration sensor 100 caused by mechanical noise (e.g., vibrations of the angular velocity sensor 200) is restricted.

The case 20 is covered and hermetically sealed by the lid 60. That is, the first to third shield patterns 91 to 93 are disposed in the closed space. Compared to the structure in which the case 20 is not covered, the noise is less likely to be applied from outside. Consequently, deterioration of detection accuracy of the acceleration sensor 100 and the angular velocity sensor 200 is restricted.

Second Embodiment

A second embodiment of the present disclosure will be described. In the present embodiment, the position of the through-via electrode 94 connecting the second shield pattern 92 and the first shield pattern 91 and the position of the through-via electrode 94 connecting the third shield pattern 93 and the first shield pattern 91 are changed from the first embodiment. The other parts are similar to the first embodiment and the descriptions thereof will not be repeated.

Figure 10:
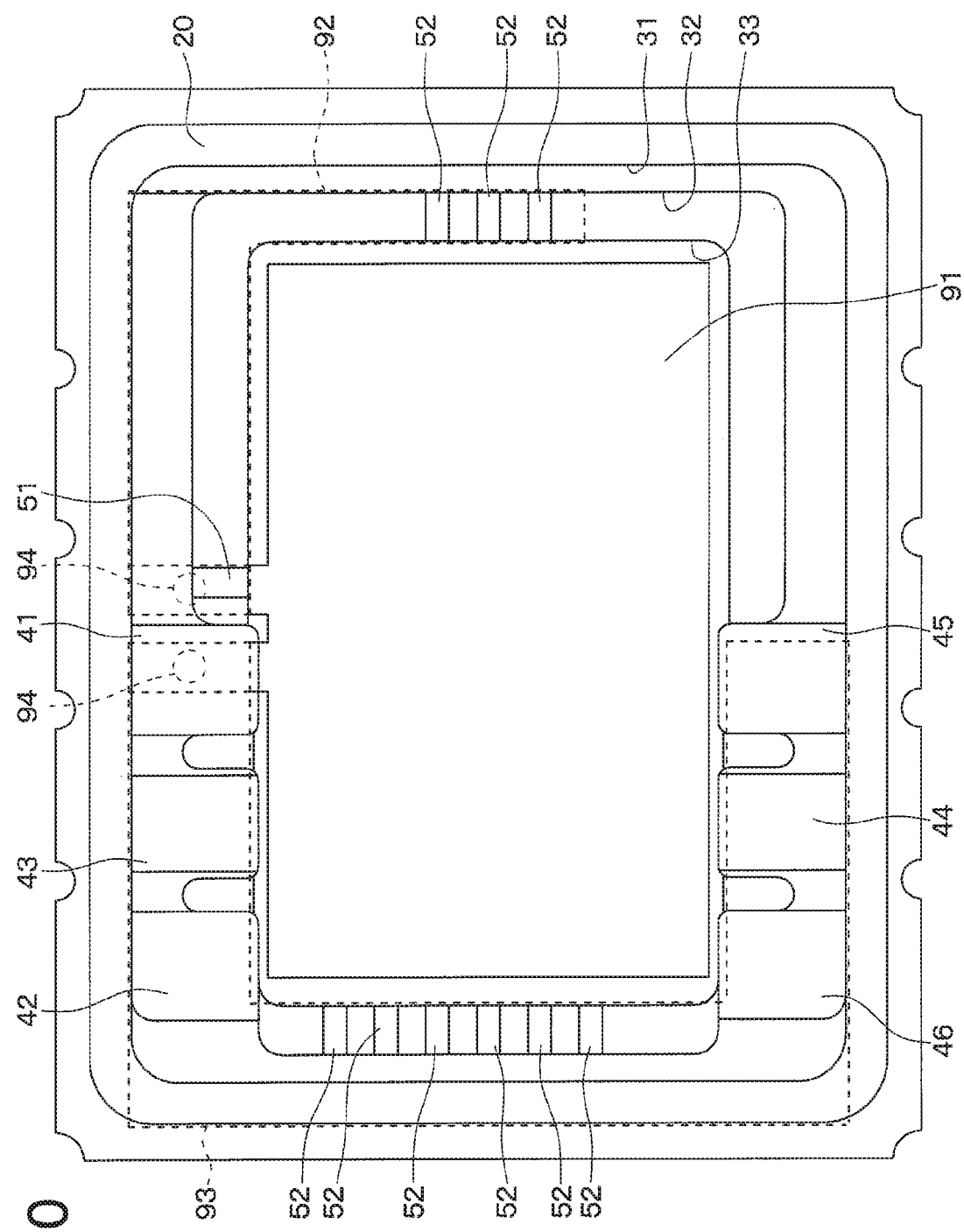
FIG. 10 is a schematic plan view of a case according to a second embodiment of the present disclosure.

In the present embodiment, as shown in FIG. 10, a portion of the second shield pattern 92 closest to the third shield pattern 93 is connected to the first shield pattern 91 through the through-via electrode 94. Similarly, a portion of the third shield pattern 93 closest to the second shield pattern 92 is connected to the first shield pattern 91 through the through-via electrode 91.

In this case, mutual propagation of the noise between the second shield pattern 92 and the third shield pattern 93 is further restricted. When the portion of the second shield pattern 92 closest to the third shield pattern 93 is not connected to the first shield pattern 91 through the through-via electrode 94, the noise applied to the second shield pattern 92 is not propagated to the first shield pattern 91 and may be directly (through the air) propagated to the third shield pattern 93 from the portion of the second shield pattern 92 closest to the third shield pattern 93. Similarly, when the portion of the third shield pattern 93 closest to the second shield pattern 92 is not connected to the first shield pattern 91 through the through-via electrode 94, the noise applied to the third shield pattern 93 is not propagated to the first shield pattern 91 and may be directly (through the air) propagated to the second shield pattern 92 from the portion of the third shield pattern 93 closest to the second shield pattern 92. On the other hand, in the present embodiment, the noise is likely to be propagated to the first shield pattern 91 from the portions of the second shield pattern 92 and the third shield pattern 93 closest to each other. Accordingly, the mutual propagation of the noise between the second shield pattern 92 and the third shield pattern 93 is further restricted.

Other Embodiments

In the above embodiments, the combination of the first sensor and the second sensor may be suitably modified. For example, the first sensor may be an acceleration sensor 100 that detects an acceleration in one direction, and the second sensor may be an acceleration sensor 100 that detects an acceleration in another direction perpendicular to the one direction.

In the above embodiments, when the acceleration sensor 100 detects the acceleration, a pulse input signal (e.g., carrier wave) having predetermined amplitude and frequency may be applied to the first and second fixed electrodes 131 and 141 (i.e., the first and second fixed electrode pads 162 and 163) from the circuit board 300. In this acceleration sensor 100, the first and second fixed electrode pads 162 and 163 function as the input terminals and the movable electrode pad 161 functions as the output terminal.

In the above embodiments, the angular velocity sensor 200 may be a capacitance-type sensor.

In the above embodiments, the second shield pattern 92 may have lower impedance than the third shield pattern 93. That is, the impedance of the second shield pattern 92 and the impedance of the third shield pattern 93 may be modified as far as the second shield pattern 92 and the third shield pattern 93 are electrically connected through the first shield pattern 91 having the lowest impedance.

Furthermore, the input terminal 161 of the acceleration sensor 100 and the output terminals 241a to 243a of the angular velocity sensor 200 may be disposed in one of the two regions divided by the virtual line K, and the output terminals 162 and 163 of the acceleration sensor 100 and the input terminal 244a of the angular velocity sensor 200 may be disposed in the remaining one of the two regions divided by the virtual line K. Also in this composite sensor, the second shield pattern 92 and the third shield pattern 93 are electrically connected through the first shield pattern 91 and the mutual interference of electrical noise between the acceleration sensor 100 and the angular velocity sensor 200 is restricted.

In the second embodiment, only one of the second shield pattern 92 and the third shield pattern 93 may be connected to the first shield pattern 91 at the portion of the second shield pattern 92 or the third shield pattern 93 adjacent to each other. For example, when the portion of the third shield pattern 93 adjacent to the second shield pattern 92 is connected to the first shield pattern 91 through the through-via electrode 94, the second shield pattern 92 may be connected to the first shield pattern 91 through the through-via electrode 94 at the portion different from the portion adjacent to the third shield pattern 93 (e.g., the portion described in the first embodiment). Similarly, when the portion of the second shield pattern 92 adjacent to the third shield pattern 93 is connected to the first shield pattern 91 through the through-via electrode 94, the third shield pattern 93 may be connected to the first shield pattern 91 through the through-via electrode 94 at the portion different from the portion adjacent to the second shield pattern 92 (e.g., the portion described in the first embodiment).

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A composite sensor comprising:
a first sensor that outputs a first sensor signal according to a detection subject;
a second sensor that outputs a second sensor signal according to a detection subject different from the detection subject of the first sensor;
a circuit board that is electrically connected to the first sensor and the second sensor; and
a mount member that has a surface above which the first sensor, the second sensor and the circuit board are disposed;
a first shield pattern that functions as a noise shield of the circuit board;
a second shield pattern that functions as a noise shield of the first sensor; and
a third shield pattern that functions as a noise shield of the second sensor, wherein:
the first shield pattern has an impedance lower than the second shield pattern and the third shield pattern; and
the second shield pattern and the third shield pattern are electrically connected to each other through the first shield pattern.

2. The composite sensor according to claim 1, wherein:
the mount member includes a case that is provided by a multi-layer board;
the multi-layer board includes a plurality of layers that are stacked in order;
each of the plurality of layers has a front surface and a rear surface opposite to the front surface;
the case has a recess that has a depth in a stack direction in which the plurality of layers are stacked;
the surface of the mount member is defined by a front surface of one of the plurality of layers and the front surface of the one of the plurality of layers defines a bottom surface of the recess of the case;
the first shield pattern is disposed on the surface of the mount member;
the second shield pattern is disposed on a front surface of one of the plurality of layers different from the front surface defining the surface of the mount member;
the third shield pattern is disposed on a front surface of one of the plurality of layers different from the front surface defining the surface of the mount member; and
the second shield pattern and the third shield pattern are electrically connected to the first shield pattern through a through-via electrode that is disposed in the case.

3. The composite sensor according to claim 2, wherein:
the mount member includes the case and a lid that covers the recess of the case; and
an interior of the recess is hermetically sealed.

4. The composite sensor according to claim 2, wherein at least one of the second shield pattern and the third shield pattern is electrically connected to the first shield pattern through the through-via electrode at a location where the second shield pattern and the third shield pattern are closest to each other when viewed in a direction normal to the surface of the mount member.

5. The composite sensor according to claim 2, wherein:
the mount member has a first sensor connection terminal that is disposed on a front surface of one of the plurality of layers and is connected to the first sensor;
the mount member has a second sensor connection terminal that is disposed on a front surface of one of the plurality of layers and is connected to the second sensor;
the one of the plurality of layers on which the second shield pattern is disposed is positioned below the one of the plurality of layers on which the first sensor connection terminal is disposed; and
the one of the plurality of layers on which the third shield pattern is disposed is positioned below the one of the plurality of layers on which the second sensor connection terminal is disposed.

6. The composite sensor according to claim 1, wherein:
the first sensor and the second sensor have input terminals to which input signals having predetermined amplitudes and predetermined frequencies are inputted;
the first sensor and the second sensor have output terminals that output the first sensor signal and the second sensor signal;
when viewed in a direction normal to the surface of the mount member, the first sensor and the second sensor are arranged in an arrangement direction;
a straight line that extends in the arrangement direction of the first sensor and the second sensor and passes through centers of the first sensor and the second sensor is referred to as a virtual line;
the input terminals of the first sensor and the second sensor are disposed in one of two regions divided by the virtual line when viewed in the direction normal to the surface of the mount member; and
the output terminals of the first sensor and the second sensor are disposed in the other one of two regions divided by the virtual line when viewed in the direction normal to the surface of the mount member.

7. The composite sensor according to claim 6, wherein:
the first sensor includes an acceleration sensor that has a movable electrode and a fixed electrode;
the movable electrode is displaceable according to an acceleration;
the fixed electrode faces the movable electrode;
the acceleration sensor outputs the first sensor signal according to a capacitance between the movable electrode and the fixed electrode;
the second sensor includes an angular velocity sensor that has a sensor portion and a support portion;
the sensor portion is made of a piezoelectric material;
the support portion has a plurality of leads;
the sensor portion is supported to be afloat in midair by one ends of the plurality of leads;
the input terminals and the output terminals are provided by the other ends of the plurality of leads opposite to the sensor portion; and
the second sensor outputs the second sensor signal according to an angular velocity applied to the second sensor during a vibration of the sensor portion.

* * * * *